US011365491B2

United States Patent
Kaneko et al.

(10) Patent No.: US 11,365,491 B2
(45) Date of Patent: Jun. 21, 2022

(54) METHOD FOR PRODUCING SIC SUBSTRATE PROVIDED WITH GRAPHENE PRECURSOR AND METHOD FOR SURFACE TREATING SIC SUBSTRATE

(71) Applicant: KWANSEI GAKUIN EDUCATIONAL FOUNDATION, Nishinomiya (JP)

(72) Inventors: Tadaaki Kaneko, Sanda (JP); Yasunori Kutsuma, Sanda (JP); Daichi Dojima, Sanda (JP)

(73) Assignee: KWANSEI GAKUIN EDUCATIONAL FOUNDATION, Nishinomiya (JP)

( * ) Notice: Subject to any disclaimer, the term of this patent is extended or adjusted under 35 U.S.C. 154(b) by 226 days.

(21) Appl. No.: 16/096,406

(22) PCT Filed: Apr. 27, 2017

(86) PCT No.: PCT/JP2017/016739
§ 371 (c)(1),
(2) Date: Oct. 25, 2018

(87) PCT Pub. No.: WO2017/188382
PCT Pub. Date: Nov. 2, 2017

(65) Prior Publication Data
US 2019/0136411 A1 May 9, 2019

(30) Foreign Application Priority Data
Apr. 27, 2016 (JP) .............................. JP2016-089089

(51) Int. Cl.
*C30B 29/36* (2006.01)
*C01B 32/188* (2017.01)
(Continued)

(52) U.S. Cl.
CPC ............ *C30B 29/36* (2013.01); *C01B 32/188* (2017.08); *C30B 23/063* (2013.01); *C30B 33/02* (2013.01); *H01L 21/3065* (2013.01)

(58) Field of Classification Search
CPC . C01B 2204/02; C01B 32/184; C01B 32/188; C30B 23/063; C30B 29/36;
(Continued)

(56) References Cited

U.S. PATENT DOCUMENTS

| 6,734,461 B1 | 5/2004 | Shiomi et al. |
| 2006/0102068 A1 | 5/2006 | Tsvetkov et al. |

(Continued)

FOREIGN PATENT DOCUMENTS

| JP | 2004351285 A | * 12/2004 |
| JP | 2008-16691 A | 1/2008 |

(Continued)

OTHER PUBLICATIONS

Tetlow et al., Growth of epitaxial graphene: Theory and experiment, Physics Reports 542 (2014) 195-295 (Year: 2014).*

(Continued)

*Primary Examiner* — Hua Qi
(74) *Attorney, Agent, or Firm* — WHDA, LLP

(57) ABSTRACT

A method includes a graphene precursor formation process of: heating a SiC substrate to sublimate Si atoms in a Si surface of the SiC substrate so that a graphene precursor is formed; and stopping the heating before the graphene precursor is covered with graphene. A SiC substrate to be treated in the graphene precursor formation process is provided with a step including a plurality of molecular layers. The step has a stepped structure in which a molecular layer whose C atom has two dangling bonds is disposed closer to the surface than a molecular layer whose C atom has one dangling bond.

11 Claims, 15 Drawing Sheets

(51) Int. Cl.
H01L 21/3065 (2006.01)
C30B 33/02 (2006.01)
C30B 23/06 (2006.01)

(58) Field of Classification Search
CPC ............... C30B 33/02; H01L 21/02019; H01L 21/02378; H01L 21/02433; H01L 21/02436; H01L 21/02527; H01L 21/02612; H01L 21/02658; H01L 21/3065
See application file for complete search history.

(56) References Cited

U.S. PATENT DOCUMENTS

| | | |
|---|---|---|
| 2011/0156058 A1 | 6/2011 | Hori et al. |
| 2014/0175458 A1* | 6/2014 | Ahn ................ H01L 21/02378 257/77 |
| 2016/0118257 A1* | 4/2016 | Kaneko ............ H01L 21/02658 438/492 |

FOREIGN PATENT DOCUMENTS

| | | |
|---|---|---|
| JP | 2009-62247 A | 3/2009 |
| JP | 201052997 A | 3/2010 |
| JP | 2010-265126 A | 11/2010 |
| JP | 2011-233780 A | 11/2011 |
| JP | 2012-176867 A | 9/2012 |
| JP | 2012-193055 A | 10/2012 |
| WO | 2014/199615 A1 | 12/2014 |
| WO | WO-2014199615 A1 * | 12/2014 ......... H01L 21/0475 |

OTHER PUBLICATIONS

K. V. Emtsev, F. Speck, Th. Seyller, and L. Ley, "Interaction, growth, and ordering of epitaxial graphene on SiC{0001} surfaces: A comparative photoelectron spectroscopy study", Physical Review B 77, 155303, (Year: 2008).*

P. J. Fisher, Luxmi, N. Srivastava, S. Nie, and R. M. Feenstra, "Thickness monitoring of graphene on SiC using low-energy electron diffraction", J. Vac. Sci. Technol. A 28(4), 958-962, Jul./Aug. 2010 (Year: 2010).*

I. Forbeaux, J.-M. Themlin, and J.-M. Debever, "Heteroepitaxial graphite on 6H—SiC(0001): Interface formation through conduction-band electronic structure", Physical Review B vol. 58, No. 24, (Year: 1998).*

C. Riedl and U. Starke, Structural properties of the graphene-SiC(0001) interface as a key for the preparation of homogeneous large-terrace graphene surfaces, Physical Review B 76, 245406 (Year: 2007).*

Tetlow, H et al., "Growth of Epitaxial Graphene: Theory and Experiment", arxiv.org, Cornell University Library, Feb. 22, 2016, 5.5.2 The growth process; pp. 49-51; figures 35-36; Cited in Partial Supplementary European Search Report dated Jan. 2, 2020. (126 pages).

Grodecki, K et al., "Micro-Raman spectroscopy of graphene grown on stepped 4H—Si C (0001) surface", Applied Physics Letters, A I P Publishing LLC, vol. 100, No. 26, Jun. 25, 2012, pp. 261604-261604; Cited in Partia Supplementary European Search Report dated Jan. 2, 2020. (4 pages).

Ushio, Shoji et al., "Wide-range temperature dependence of epitaxial graphene growth on 4H—SiC (000 1): A study of ridge structures formation dynamics associated with temperature", Journal of Crystal Growth, vol. 318, No. 1, Nov. 18, 2010, pp. 590-594; Cited in Partial Supplementary European Search Report dated Jan. 2, 2020. (5 pages).

Partial Supplementary European Search Report dated Jan. 2, 2020, issued in counterpart EP Application No. 17 78 9664.4. (15 pages).

International Search Report dated Jul. 25, 2017, issued in counterpart application No. PCT/JP2017/016739 (2 pages).

International Search Report dated Sep. 2, 2014, issued in counterpart Application No. PCT/JP2014/003049 (1 page).

Non-Final Office Action dated Sep. 13, 2016, issued in U.S. Appl. No. 14/897,342 (8 pages).

Final Office Action dated Feb. 14, 2017, issued in U.S. Appl. No. 14/897,342 (10 pages).

Non-Final Office Action dated Aug. 7, 2017, issued in U.S. Appl. No. 14/897,342 (13 pages).

* cited by examiner

Fig.9
(a) 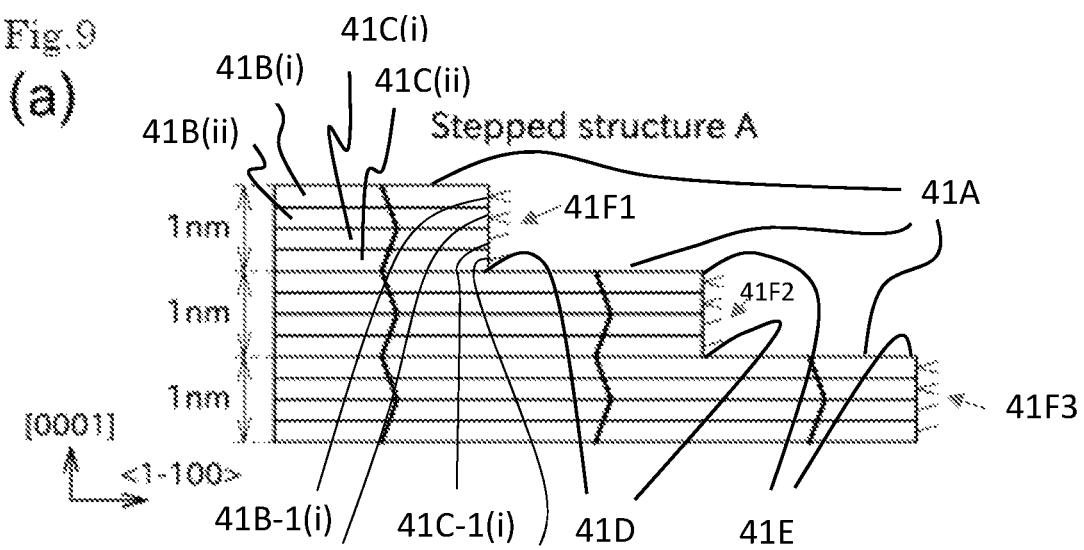
(b) 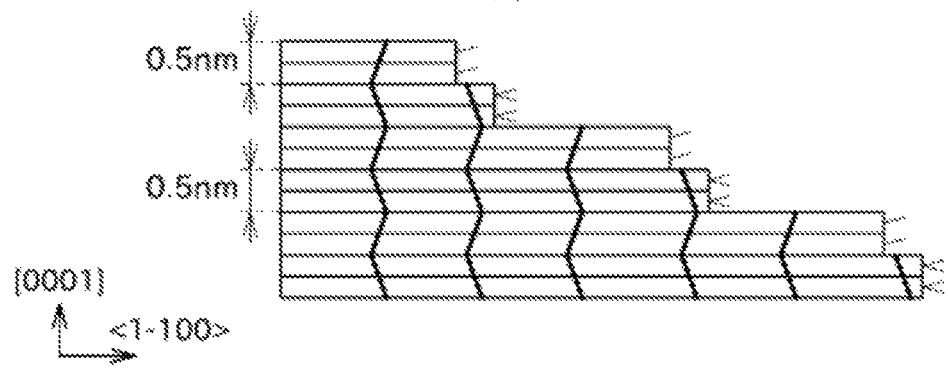
(c) 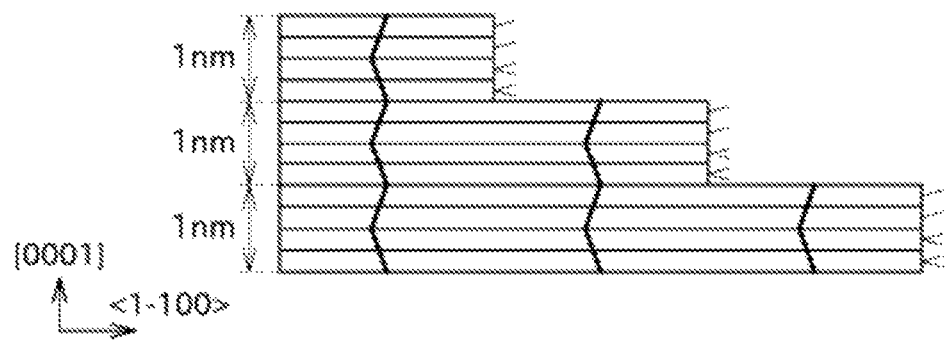

Fig.11

| Heating period | Schematic diagram | SEM image |
|---|---|---|
| 0min | | |
| 5min | | |
| 10min | | |
| 15min | | |
| 30min | | |

METHOD FOR PRODUCING SIC SUBSTRATE PROVIDED WITH GRAPHENE PRECURSOR AND METHOD FOR SURFACE TREATING SIC SUBSTRATE

TECHNICAL FIELD

The present invention relates mainly to a method for forming a graphene precursor on a SiC substrate.

BACKGROUND ART

Graphene is recently attracting attention as one of high electron mobility materials. Graphene is a crystal of C atoms in a six-membered ring, with its thickness corresponding to one atom. Graphene is difficult to make, because its thickness corresponds to one atom. Various methods for making the same have been proposed conventionally. Patent Literature 1 (PTL 1) and Patent Literature 2 (PTL 2) disclose methods for forming graphene on a SiC substrate.

PTL 1 shows heating a SiC substrate in vacuum to sublimate Si atoms of the SiC substrate so that remaining C atoms are graphenized. PTL 1 shows formation of one or more graphene sheets. PTL 1 does not mention a structure between the SiC substrate and the graphene sheet.

PTL 2 shows a configuration in which a SiC substrate is covered with graphene in order that Si atoms cannot be sublimated while ions implanted in the SiC substrate are activated (i.e., heated). PTL 2 also shows that heating a SiC substrate in vacuum graphenizes a surface of the SiC substrate. PTL 2 shows formation of an interfacial layer (graphene precursor) on a SiC substrate and formation of a plurality of graphene layers on the interfacial layer. In PTL 2, the graphene layers are removed after activation of ions.

CITATION LIST

Patent Literature

PTL 1: Japanese Patent Application Laid-Open No. 2009-62247
PTL 2: Japanese Patent Application Laid-Open No. 2011-233780

SUMMARY OF INVENTION

Technical Problem

In PTL 2, an interfacial layer is formed on a SiC substrate, and graphene is formed on the interfacial layer. In PTL 1, no special treatment is disclosed, and therefore it would be reasonable to consider that graphene is formed on an interfacial layer. Since the interfacial layer is made of C atoms, the graphene is electrically influenced by the interfacial layer. In other words, the graphene formed on the interfacial layer has a structure similar to graphite, and thus a high electron mobility which is a characteristic of graphene is lowered.

In this respect, however, PTL 1 and PTL 2 do not mention a method for forming graphene on a SiC substrate without interposition of an interfacial layer. In particular, PTL 2 does not mention a structure of a SiC substrate where graphene is likely to form.

The present invention has been made in view of the circumstances described above, and a primary object of the present invention is to provide a method for forming graphene on a SiC substrate without interposition of an interfacial layer made of C atoms.

Solution to Problem and Advantageous Effects

Problems to be solved by the present invention are as described above. Solutions to the problems and advantageous effects thereof will now be described.

A first aspect of the present invention provides a method for producing a SiC substrate with a graphene precursor, as follows. The production method includes a graphene precursor formation process of: heating a SiC substrate to sublimate Si atoms in a Si surface of the SiC substrate so that a graphene precursor is formed; and stopping the heating before the graphene precursor is covered with graphene. A SiC substrate to be treated in the graphene precursor formation process is provided with a step including a plurality of molecular layers. The step has a stepped structure in which a molecular layer whose C atom has two dangling bonds is disposed closer to the surface than a molecular layer whose C atom has one dangling bond.

Using the SiC substrate having such a stepped structure enables the graphene precursor to be uniformly formed on the Si surface of the SiC substrate. It therefore is possible to obtain a structure in which the graphene precursor is formed substantially throughout the Si surface of the SiC substrate and in addition the graphene precursor is not covered with the graphene. For example, inserting another element between the SiC substrate and the graphene precursor enables the graphene to be disposed directly on the SiC substrate. In such a configuration, an electron state of the graphene can be changed by changing the element inserted between the SiC substrate and the graphene precursor.

In the method for producing a SiC substrate with a graphene precursor, it is preferable that the SiC substrate is provided with an off-angle relative to <1-100> direction.

Providing the off-angle in this direction allows the above-described stepped structure to be formed easily.

In the method for producing a SiC substrate with a graphene precursor, it is preferable that in a case where the SiC substrate to be treated in the graphene precursor formation process is made of 4H—SiC, a step including four molecular layers is formed, and in two of the molecular layers at higher positions in the step, a C atom has two dangling bonds, while in two of the molecular layers at lower positions in the step, a C atom has one dangling bond.

Thus, by adjusting treatment conditions, the SiC substrate having the above-described stepped structure formed on a substantially entire surface thereof can be obtained, and therefore the SiC substrate with the graphene precursor can be produced efficiently.

In the method for producing a SiC substrate with a graphene precursor, it is preferable that an etching process is performed prior to the graphene precursor formation process, the etching process including etching the SiC substrate by heating the SiC substrate under Si vapor pressure.

Etching the SiC substrate in this manner allows the above-described stepped structure to be formed easily.

In the method for producing a SiC substrate with a graphene precursor, it is preferable that the etching process is performed under a predetermined treatment condition including at least a heating temperature and an etching rate.

Performing the etching in consideration of such treatment conditions allows the above-described stepped structure to be formed easily.

In the method for producing a SiC substrate with a graphene precursor, it is preferable that the etching process is performed at an etching rate of 1 µm/min or more.

This allows the above-described stepped structure to be formed easily.

In the method for producing a SiC substrate with a graphene precursor, the graphene precursor formation process is preferably performed at 1400° C. or more and 2000° C. or less, and more preferably performed at 1550° C. or more and 1650° C. or less.

When the heating temperature is too high, the speed at which the graphene precursor is formed increases excessively, which causes a risk that stopping the treatment at a timing when the graphene precursor is formed in a desired range may be difficult or a surface of the SiC substrate may be roughened. When the heating temperature is too low, the graphene precursor is not formed appropriately. Considering these, performing the graphene precursor formation process in the above-mentioned temperature range makes it possible to control a range where the graphene precursor is formed with a good accuracy.

In the method for producing a SiC substrate with a graphene precursor, it is preferable that the graphene precursor formation process is performed in a state where the SiC substrate is received in a treatment container having at least its inner surface made of pyrolytic carbon.

Since pyrolytic carbon is less reactive with sublimated Si atoms, an environment (e.g., the kind of existing vapor, the pressure, etc.) within the treatment container can be highly reproducible. Accordingly, a range where the graphene precursor is formed can be controlled with a good accuracy.

In the method for producing a SiC substrate with a graphene precursor, it is preferable that in the graphene precursor formation process, the graphene precursor is formed uniformly from a proximal end side toward a distal end side of the step of the SiC substrate.

This can provide a structure in which, for example, the graphene precursor having substantially the same width is formed at fixed intervals. Accordingly, the graphene having a desired bandgap can be produced.

In the graphene precursor, it is preferable that a shape obtained by multiplying one side of a diamond shape formed by connecting four adjacent Si atoms in the Si surface of the SiC substrate by $6\sqrt{3}$ and rotating a resultant by 30° about a rotation axis extending in a direction orthogonal to the Si surface serves as a minimum pattern of overlap between an arrangement pattern of Si atoms in the Si surface and an arrangement pattern of C atoms in the graphene precursor.

Since the arrangement pattern of Si atoms in the Si surface and the arrangement pattern of C atoms in the graphene precursor overlap each other, relatively strong connection between the graphene precursor and the SiC substrate can be obtained.

A second aspect of the present invention provides a method for producing a SiC substrate with graphene, wherein the SiC substrate with the graphene precursor produced by the production method is subjected to a process of inserting an element between the graphene precursor and the SiC substrate, thereby breaking joint between the graphene precursor and the SiC substrate, to form graphene on the SiC substrate without interposition of the graphene precursor therebetween.

Accordingly, just by changing an element to be inserted, SiC substrates with graphene having different electron states can be produced from identical SiC substrates with a graphene precursor.

A third aspect of the present invention provides a method for identifying a treatment condition for the graphene precursor formation process, wherein whether or not the SiC substrate for use in the graphene precursor formation process has the stepped structure is identified based on brightness and darkness on an SEM image that is obtained by radiating an electron beam from a scanning electron microscope in a direction inclined relative to a height direction of the step of the SiC substrate.

Since the stepped structure can be identified based on brightness and darkness on the SEM image, it is easy to identify a treatment condition necessary for obtaining the stepped structure.

The method for identifying a treatment condition for the graphene precursor formation process is preferably configured as follows. The graphene precursor formation process is performed in a state where the SiC substrate is received in a treatment container. The graphene precursor formation process is performed in a plurality of the treatment containers having different capacities, and whether the graphene precursor is formed uniformly from a proximal end side toward a distal end side of the step of the SiC substrate or the graphene precursor is formed non-uniformly on the SiC substrate is observed to identify a capacity required of the treatment container.

Accordingly, it is easy to identify a capacity of the receiving container necessary for uniform formation of the graphene precursor.

A fourth aspect of the present invention provides a method for surface-treating a SiC substrate as follows. The method includes etching a SiC substrate by heating the SiC substrate under Si vapor pressure, to form a step including a plurality of molecular layers on a surface of the SiC substrate. At least an etching rate for the etching and a heating temperature for the heating are adjusted to selectively form any of a plurality of types of stepped structures that are different from one another in at least either of the number of molecular layers included in a step formed on the SiC substrate or the number of dangling bonds of each C atom in the molecular layers.

This makes it possible to selectively obtain a SiC substrate having a stepped structure suitable for a purpose. A stepped structure of the SiC substrate is influential in a case of, for example, forming a graphene precursor, an epitaxial layer, or the like. Thus, a process for forming them can be appropriately performed if it is possible to selectively obtain a predetermined stepped structure.

The method for surface-treating a SiC substrate is preferably as follows. The SiC substrate is made of 4H—SiC. The stepped structures include a stepped structure A, a stepped structure B, and a stepped structure C. Any of the stepped structure A, the stepped structure B, and the stepped structure C is selectively formed. In the stepped structure A, a step including four molecular layers is formed, and in two of the molecular layers at higher positions in the step, a C atom has two dangling bonds, while in two of the molecular layers at lower positions in the step, a C atom has one dangling bond. In the stepped structure B, a step including two molecular layers is formed, and the step comprises a first step and a second step alternately repeated, the first step including two molecular layers in both of which a C atom has one dangling bond, the second step including two molecular layers in both of which a C atom has two dangling bonds. In the stepped structure C, a step including four molecular layers is formed, and in two of the molecular layers at higher positions in the step, a C atom has one dangling bond, while in two of the molecular layers at lower positions in the step, a C atom has two dangling bonds.

Accordingly, in the SiC substrate made of 4H—SiC, any of the stepped structures A to C can be selectively obtained.

The method for surface-treating a SiC substrate preferably includes, after a stepped structure is formed on the SiC substrate, identifying whether or not the SiC substrate has the stepped structure based on brightness and darkness on an SEM image that is obtained by radiating an electron beam from a scanning electron microscope in a direction inclined relative to a height direction of the step of the SiC substrate.

Since the stepped structure can be identified based on brightness and darkness on the SEM image, it is possible to check whether or not a predetermined stepped structure is formed.

BRIEF DESCRIPTION OF DRAWINGS

FIG. 9 is a diagram showing three types of stepped structures which are obtained by etching under Si vapor pressure.

FIG. 11 is schematic diagrams and SEM images, showing a situation where a graphene precursor is gradually formed on steps of a SiC substrate.

DESCRIPTION OF EMBODIMENTS

An embodiment of the present invention will now be described with reference to the drawings. First, referring to FIG. 1, a high-temperature vacuum furnace 20 used for a heat treatment according to this embodiment will be described.

Figure 1:
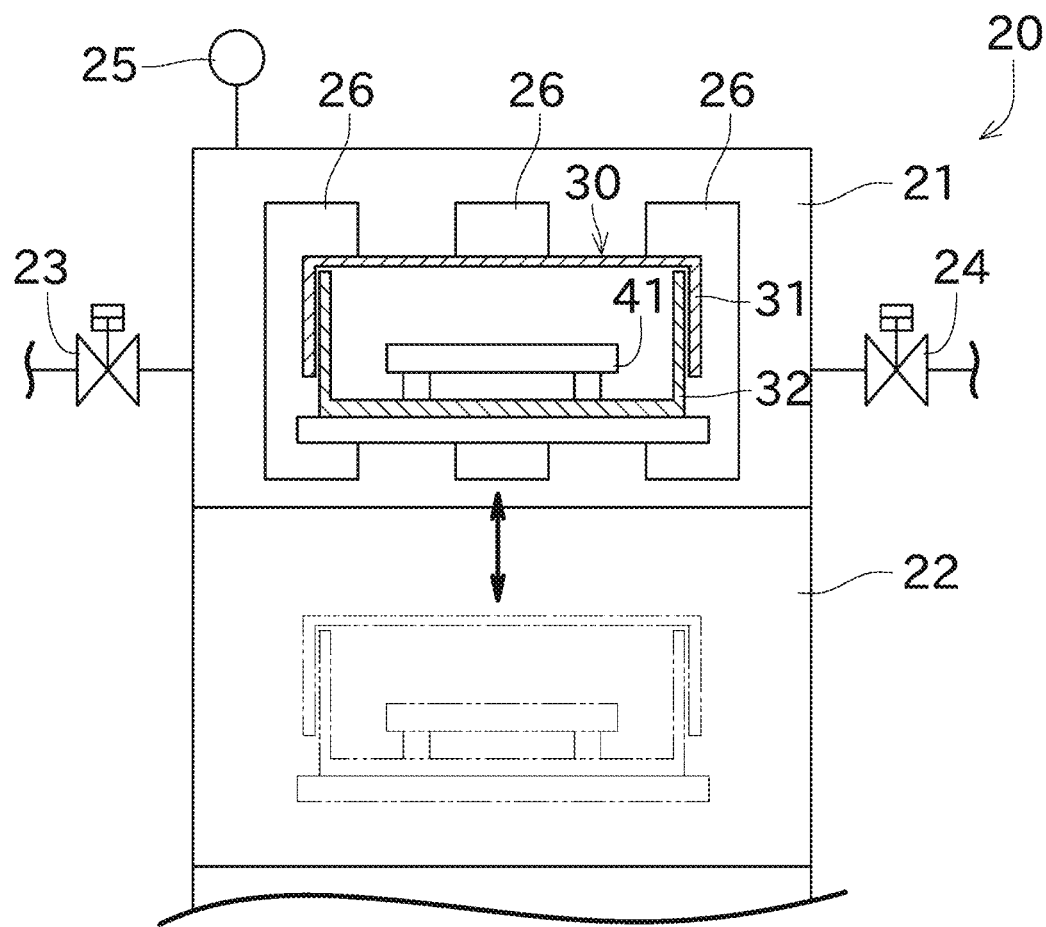
FIG. 1 is an overview of a high-temperature vacuum furnace used for a heat treatment according to the present invention.

As shown in FIG. 1, the high-temperature vacuum furnace (heating apparatus) 20 includes a main heating chamber 21 and a preheating chamber 22. The main heating chamber 21 is configured to heat a SiC substrate 41 (single crystal SiC substrate) to a temperature of 1000° C. or more and 2300° C. or less, the SiC substrate 41 having at least its surface made of single crystal SiC. The preheating chamber 22 is a space for preheating the SiC substrate 41 prior to heating in the main heating chamber 21.

Connected to the main heating chamber 21 are a vacuum forming valve 23, an inert gas injection valve 24, and a vacuum gauge 25. The vacuum forming valve 23 is configured to adjust the degree of vacuum of the main heating chamber 21. The inert gas injection valve 24 is configured to adjust an inert gas (e.g., an Ar gas) pressure in the main heating chamber 21. The vacuum gauge 25 is configured to measure the degree of vacuum in the main heating chamber 21.

The main heating chamber 21 has heaters 26 disposed therein. A heat reflecting metal plate (not shown) is fixed to a side wall and a ceiling of the main heating chamber 21. The heat reflecting metal plate is configured to reflect heat of the heaters 26 toward a central portion of the main heating chamber 21. This enables the SiC substrate 41 to be heated strongly and equally, to raise the temperature thereof up to 1000° C. or more and 2300° C. or less. Examples of the heater 26 may include a heater of resistance heating type and a heater of high frequency induction heating type.

The SiC substrate 41 is heated while being received in a crucible (receiving container) 30. The crucible 30 is placed on, for example, an appropriate holder. Movement of the holder allows the SiC substrate 41 to move at least from the preheating chamber to the main heating chamber. The crucible 30 includes an upper container 31 and a lower container 32 which are fittable to each other.

The crucible 30 can be made of any material as long as the material is capable of withstanding a heat treatment temperature. Different crucibles 30 may be used depending on a process. For example, it may be acceptable that a crucible 30 having at least its inner surface made of tantalum carbide is used for etching under Si vapor pressure which will be described later while a crucible 30 having at least its inner surface made of pyrolytic carbon is used for a graphene precursor formation process.

To perform a heat treatment on the SiC substrate 41, first, the crucible 30 is disposed in the preheating chamber 22 of the high-temperature vacuum furnace 20 as indicated by the dot and dash lines in FIG. 1, and preheating is performed at an appropriate temperature (e.g., about 800° C.). Then, the crucible 30 is moved to the main heating chamber 21 whose temperature has been raised to a set temperature (e.g., about 1800° C.) in advance. Then, the SiC substrate 41 is heated with adjustment of a pressure and the like. The preheating may be omitted.

Figure 2:
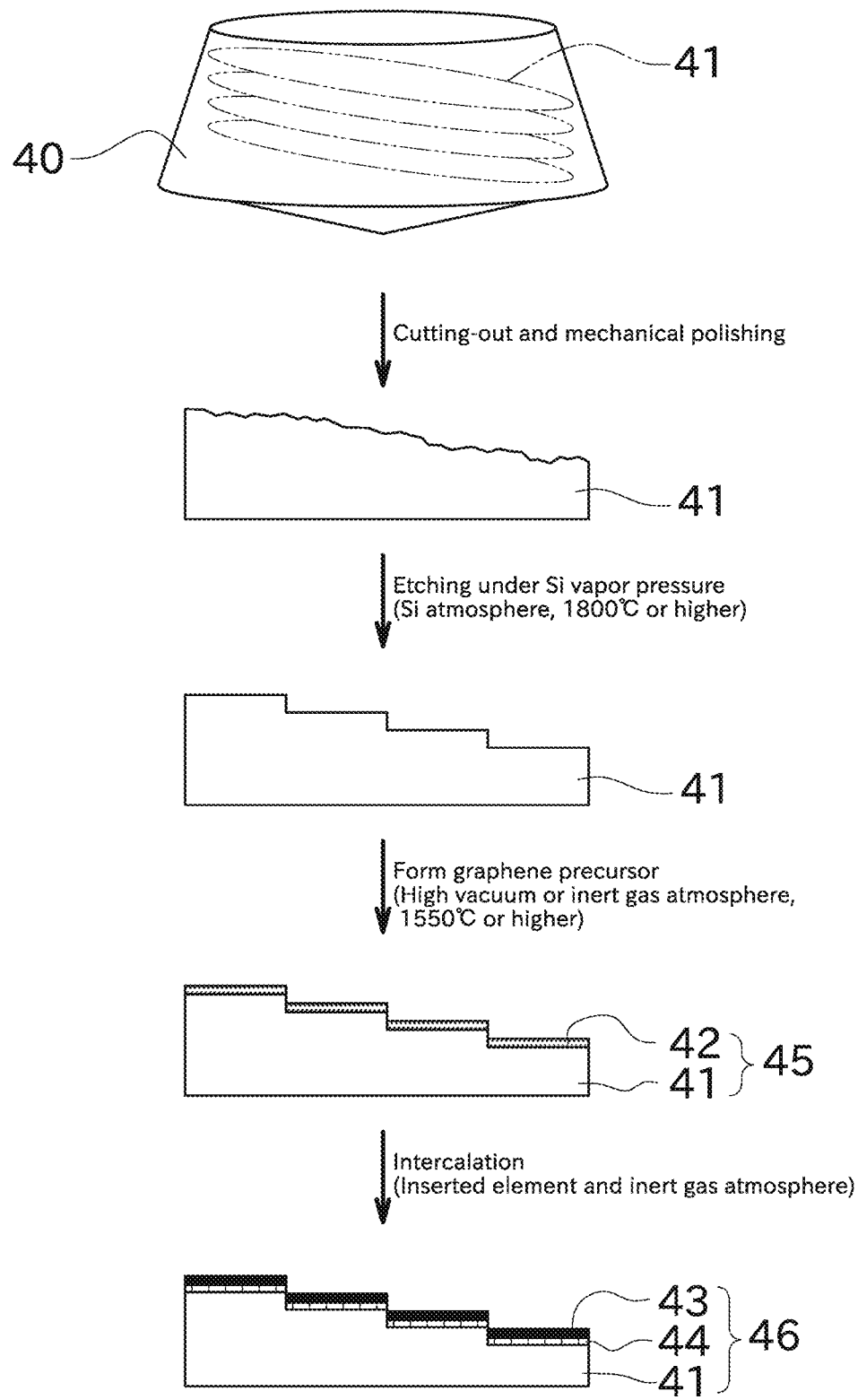
FIG. 2 is a diagram showing a process for producing a SiC substrate with graphene from an ingot.

Next, referring to FIG. 2, a process flow for producing a SiC substrate with graphene will be briefly described.

First, an ingot 40 is cut with predetermined intervals by using cutting means such as a diamond wire, to cut out a plurality of SiC substrates 41 from the ingot 40. In particular, the cutting-out from the ingot 40 is implemented obliquely relative to a SiC molecular layer. Thereby, a SiC substrate 41 having an off-angle can be obtained. Of the SiC substrate 41 thus cut out, a cut surface is polished by mechanical polishing, chemical-mechanical polishing, or the like.

Then, the SiC substrate 41 undergoes etching under Si vapor pressure. More specifically, the SiC substrate 41 is received in the crucible 30, and is heated with use of the high-temperature vacuum furnace 20 in a temperature range of 1500° C. or more and 2200° C. or less, and preferably in a temperature range of 1800° C. or more and 2000° C. or less, under a high-purity Si vapor pressure. Heating the SiC substrate 41 under these conditions allows its surface to be etched with being planarized. In the etching under Si vapor pressure, the following reaction occurs. In short, as a result of the SiC substrate 41 being heated under the Si vapor pressure, SiC of the SiC substrate 41 is thermally decomposed and chemically reacted with Si, and thus is sublimated in the form of $Si_2C$, $SiC_2$, or the like. In addition, Si of a Si atmosphere is bonded with C on a surface of the SiC substrate 41 to cause self-organization, so that the surface of the SiC substrate 41 is planarized.

$$SiC(s) \rightarrow Si(v) + C(s) \quad (1)$$

$$2SiC(s) \rightarrow Si(v) + SiC_2(v) \quad (2)$$

$$SiC(s) + Si(v) \rightarrow Si_2C(v) \quad (3)$$

To have high-purity Si in the crucible 30, any Si supply source may be employed. For example, Si in a solid state may be disposed in the crucible 30, or a wall surface of the crucible 30 may be made of tantalum silicide.

Figure 3:
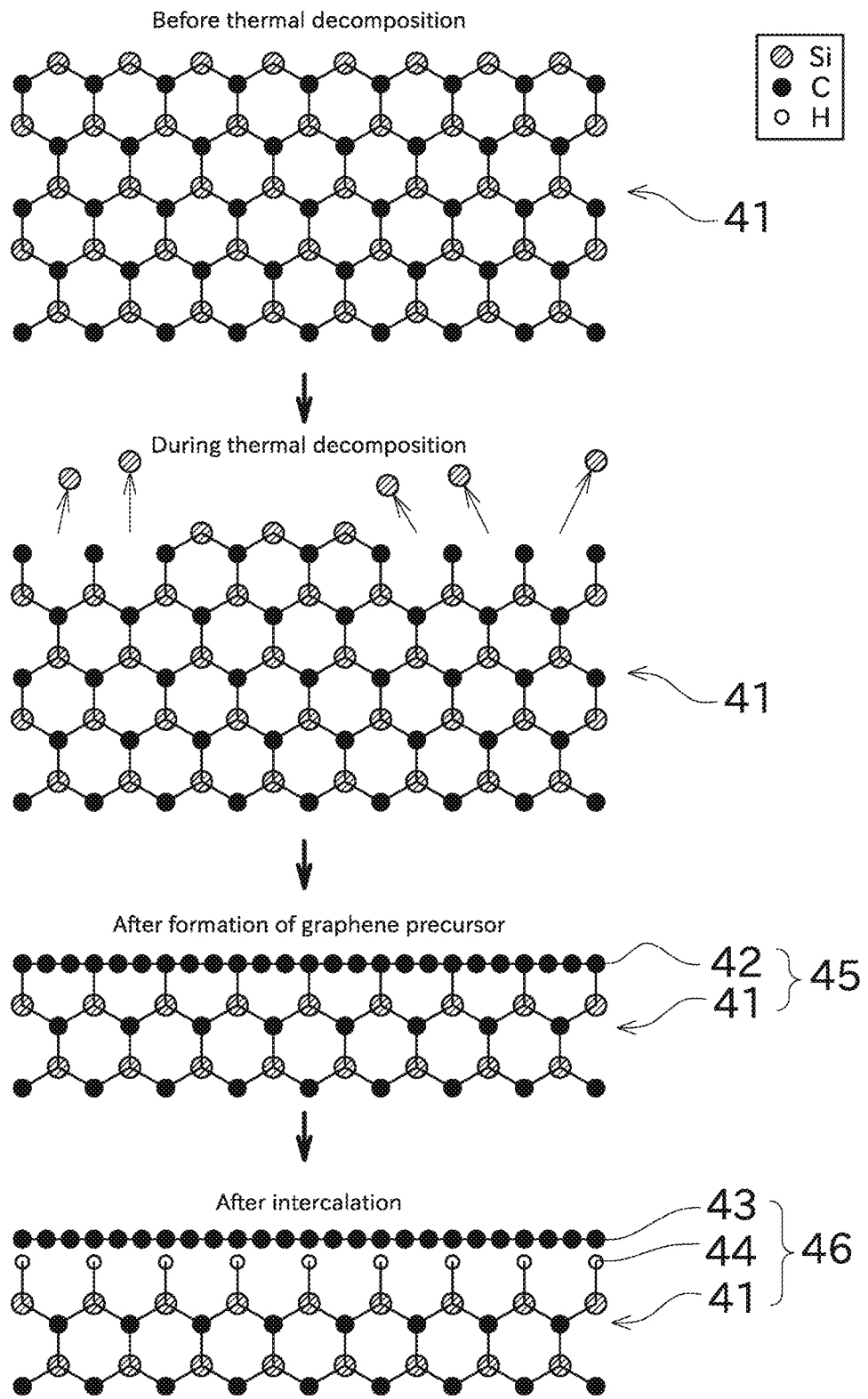
FIG. 3 is a diagram showing a molecular arrangement in a case of performing a graphene precursor formation process and an intercalation.

Then, the SiC substrate 41 undergoes a graphene precursor formation process. To be specific, heating is performed under a high vacuum or under an inert gas atmosphere at 1500° C. or more and 2200° C. or less, or at 1400° C. or more and 2000° C. or less, or preferably at 1550° C. or more and 1650° C. or less. The inert gas pressure is preferably $10^{-5}$ Pa or more and 100 kPa or less, and more preferably about 10 kPa. The Si pressure is preferably $10^{-5}$ Pa or more and 1 Pa or less. As a result, Si atoms in a Si surface of the SiC substrate 41 are sublimated, so that remaining C atoms form a graphene precursor 42, as shown in FIG. 3. In this manner, a SiC substrate 45 with a graphene precursor is produced.

As shown in FIG. 3, the graphene precursor 42 is made up of C atoms. The thickness of the graphene precursor 42 is equal to the thickness of one C atom. The graphene precursor 42 is connected to Si atoms in the Si surface of the SiC substrate 41. In detail, one out of every three C atoms in the graphene precursor 42 is connected to a Si atom in the Si surface of the SiC substrate 41. Due to this connection, the graphene precursor 42 has an electron mobility lower than that of graphene 43. If this connection is broken, the graphene precursor 42 becomes the graphene 43.

Figure 4:
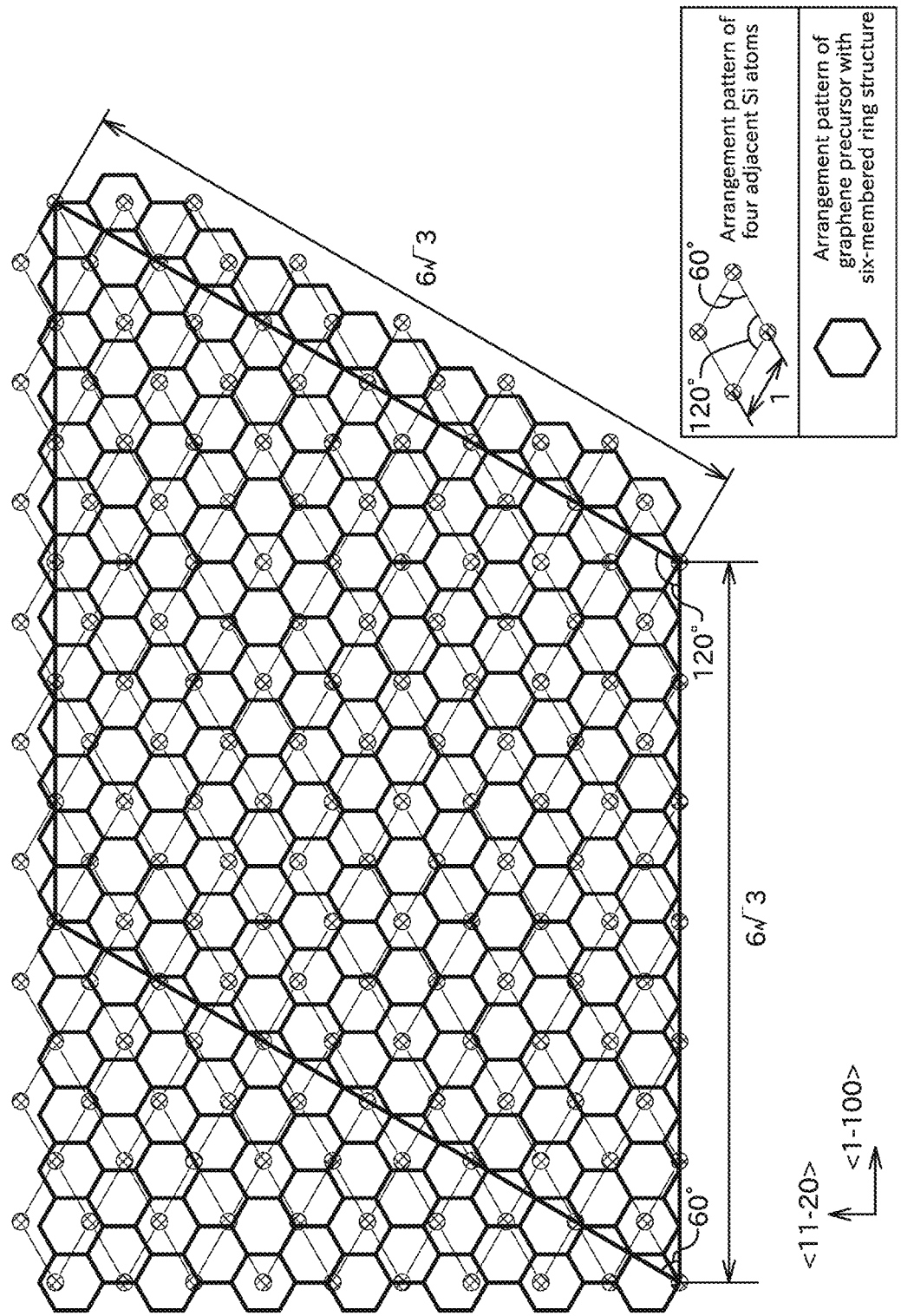
FIG. 4 is a diagram showing a relationship between a graphene precursor formed on a Si surface of a SiC substrate and Si atoms of the Si surface.

As shown in FIG. 4, the graphene precursor 42 has a six-membered ring structure when viewed in its thickness direction. A relationship between an arrangement pattern of the graphene precursor 42 and an arrangement pattern of Si atoms in the Si surface of the SiC substrate 41 is as follows. On the Si surface of the SiC substrate 41, there are arrangement patterns each made up of four adjacent Si atoms. Each of the Si-atom arrangement patterns has a diamond shape with interior angles of 60° and 120°, as shown in FIG. 4. The Si-atom arrangement pattern is rotated counterclockwise by 30°, and then the length of each side thereof is multiplied by 6√3. A resulting shape (which is a diamond shape indicated by the thick line in FIG. 4) is a minimum pattern of overlap between the arrangement pattern of Si atoms in the SiC substrate 41 and the arrangement pattern of C atoms in the graphene precursor 42. This structure enables the graphene precursor 42 to be stably formed on the SiC substrate 41.

The SiC substrate 45 with the graphene precursor then undergoes intercalation, as shown in FIG. 2 and FIG. 3. The intercalation is a process of inserting another element between the SiC substrate 41 and the graphene precursor 42. This breaks the connection between the graphene precursor 42 and the SiC substrate 41, so that the graphene precursor 42 becomes the graphene 43. In addition, an intercalant layer 44 which is a layer of the inserted element is formed between the SiC substrate 41 and the graphene 43. In this manner, a SiC substrate 46 with graphene can be produced.

Figure 5:
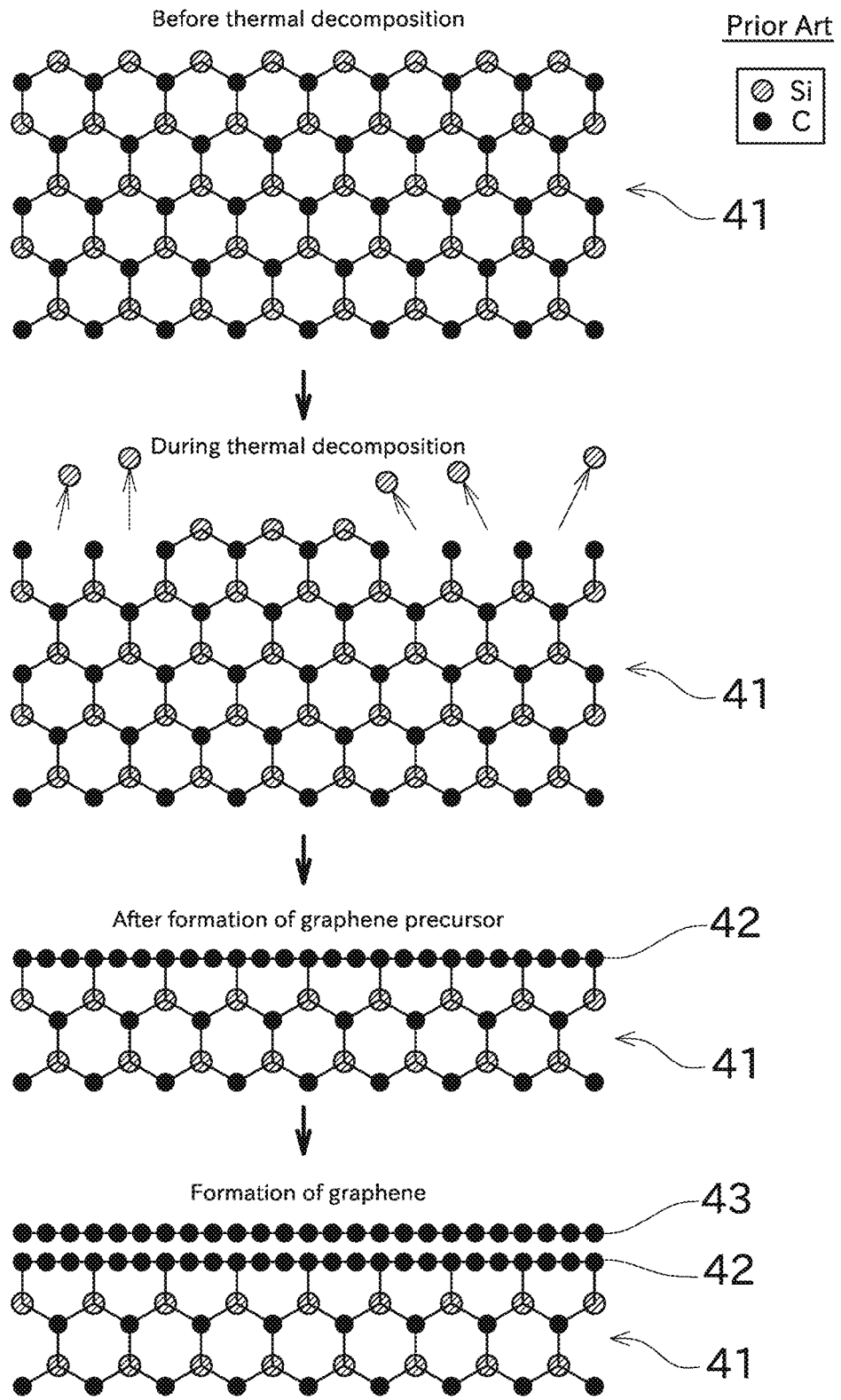
FIG. 5 is a diagram showing a molecular arrangement in a case of forming graphene according to a conventional example.

It however is not easy to produce the SiC substrate 45 with the graphene precursor, for the following reason. If the heat treatment progresses after formation of the graphene precursor 42, the graphene precursor 42 becomes the graphene 43 and moreover a graphene precursor 42 is formed inside the graphene 43, as shown in FIG. 5. In this configuration, the electron mobility of the graphene 43 is lowered due to an electrical influence given by the graphene precursor 42. To exert a high electron mobility which is a characteristic of graphene, the treatment needs to be stopped at a timing when the graphene precursor 42 is firstly formed on the SiC substrate 41 (at a timing when only one carbonization layer occurs). In this respect, timely stopping the treatment is difficult for the conventional method, because it involves a risk that the graphene precursor 42 may be non-uniformly formed on the SiC substrate 41 or the speed at which the graphene precursor 42 is formed cannot be grasped exactly.

Considering the above, this embodiment identifies a SiC substrate 41 having an optimal structure, and employs a method of preferentially generating the SiC substrate 41 having such a structure.

Figure 6:
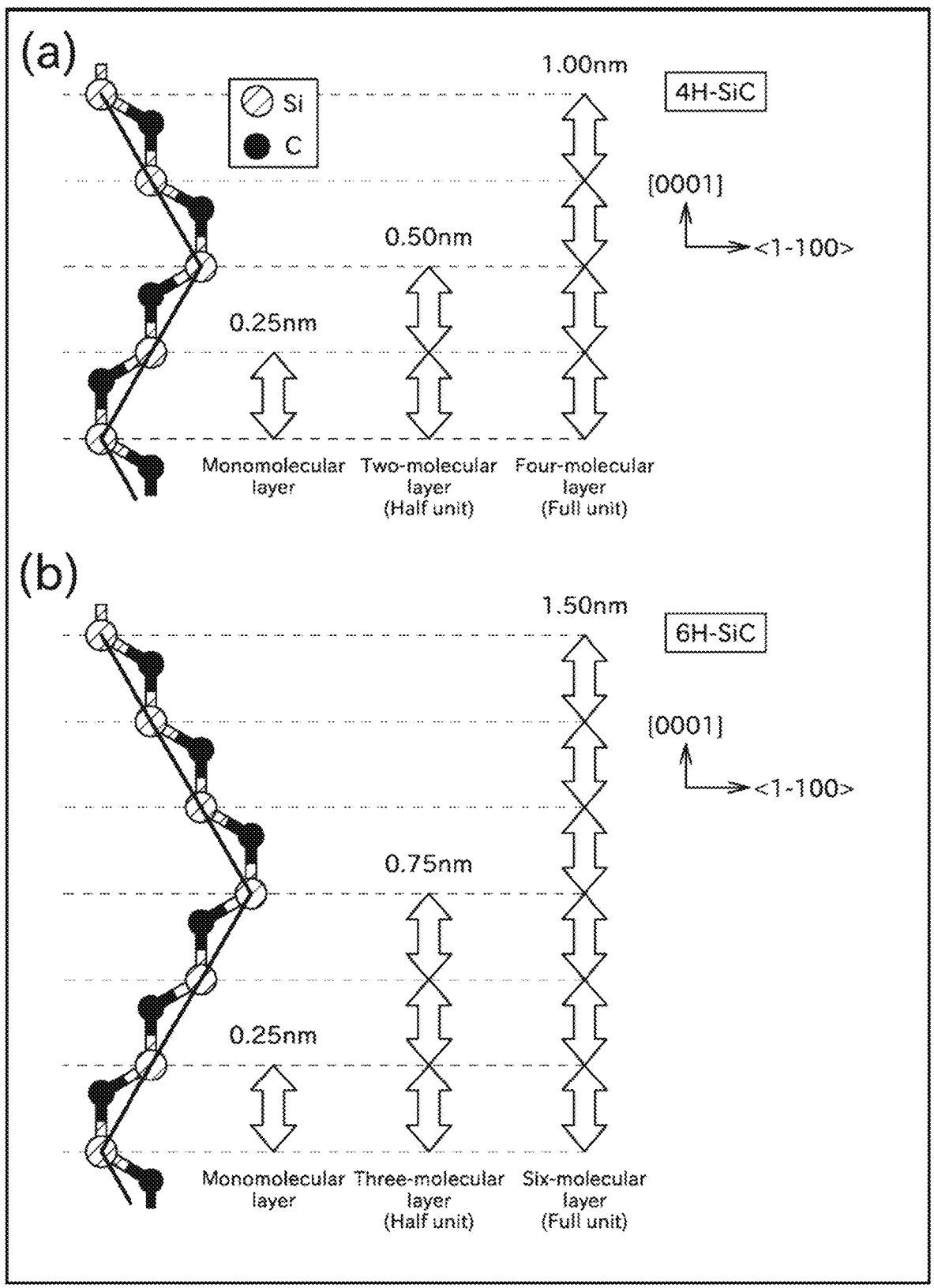
FIG. 6 is a schematic diagram showing molecular arrangements and periods of 4H—SiC and 6H—SiC.

First, referring to FIG. 6, a SiC molecular arrangement will be described. As shown in FIG. 6, a hexagonal SiC single crystal is configured such that a stack orientation (a direction in which molecular layers made of Si—C are stacked) turns every half period between a direction close to <1-100> direction and its opposite direction. In a case of 4H—SiC, a Si-atom stack orientation is reversed by every 2 L, where L represents the interval between Si—C pairs (see the thick line in FIG. 6(a)). A C-atom stack orientation is also reversed by every 2 L, though a thick line indicative thereof is not shown.

In a case of 6H—SiC, a Si-atom stack orientation is reversed by every 3 L, where L represents the interval between atoms (see the thick line in FIG. 6(b)). A C-atom stack orientation is also reversed by every 3 L, though a thick line indicative thereof is not shown. Thus, a SiC stack direction of single crystal SiC varies depending on a cutting position, and its properties also vary accordingly.

Figure 7:
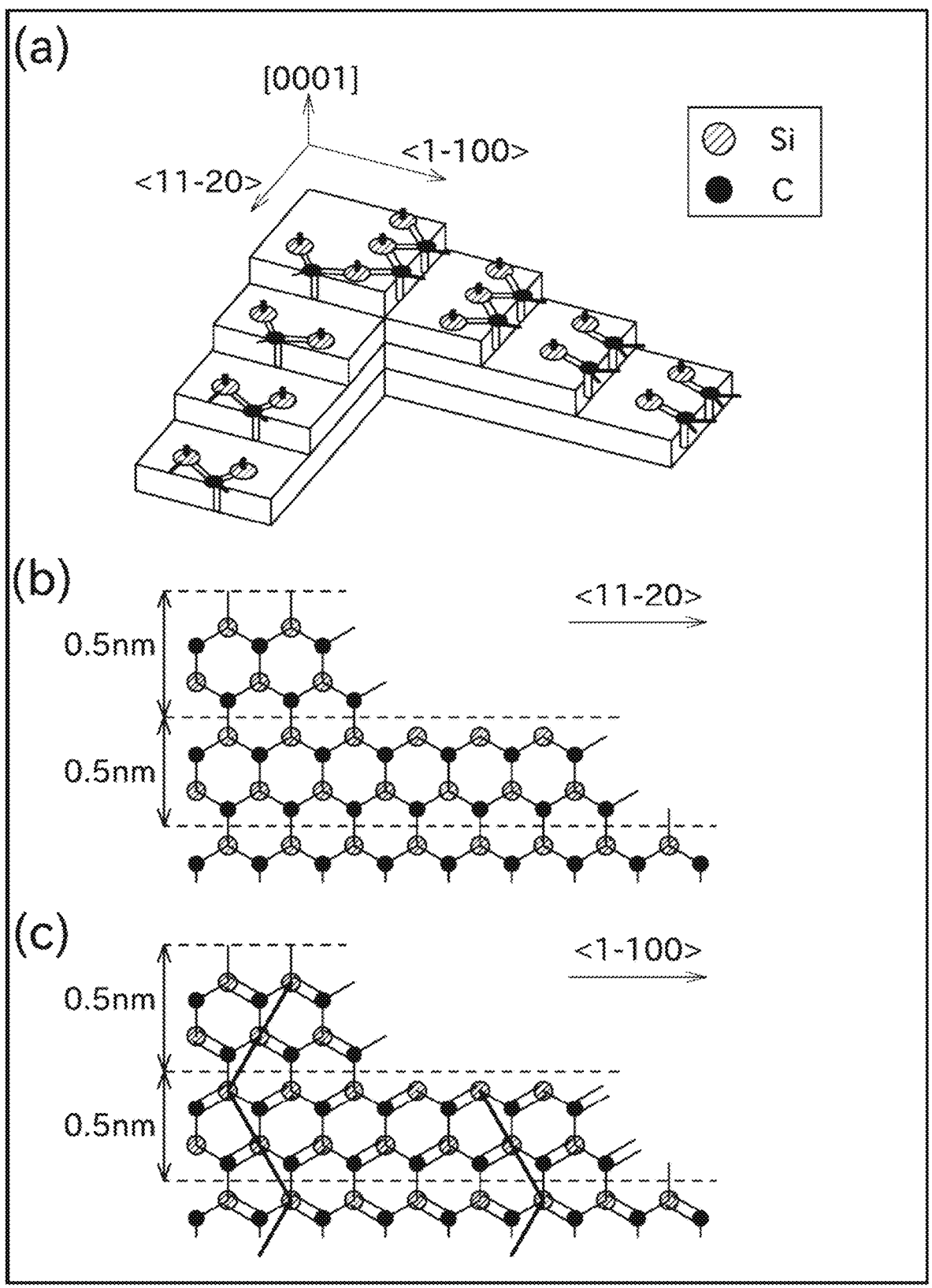
FIG. 7 is a schematic diagram showing two types of off-angles of 4H—SiC and cross-sections of 4H—SiC at the respective off-angles.

In addition, as shown in FIG. 7, the molecular arrangement in the SiC substrate 41 also varies depending on a direction in which the off-angle is provided, and its properties vary accordingly. FIG. 7(a) is a perspective view schematically showing a structure having an off-angle relative to <11-20> direction and a structure having an off-angle relative to <1-100> direction. FIG. 7(b) is a cross-sectional view schematically showing a structure having an off-angle relative to <11-20> direction. FIG. 7(c) is a cross-sectional view schematically showing a structure having an off-angle relative to <1-100> direction.

Figure 8:
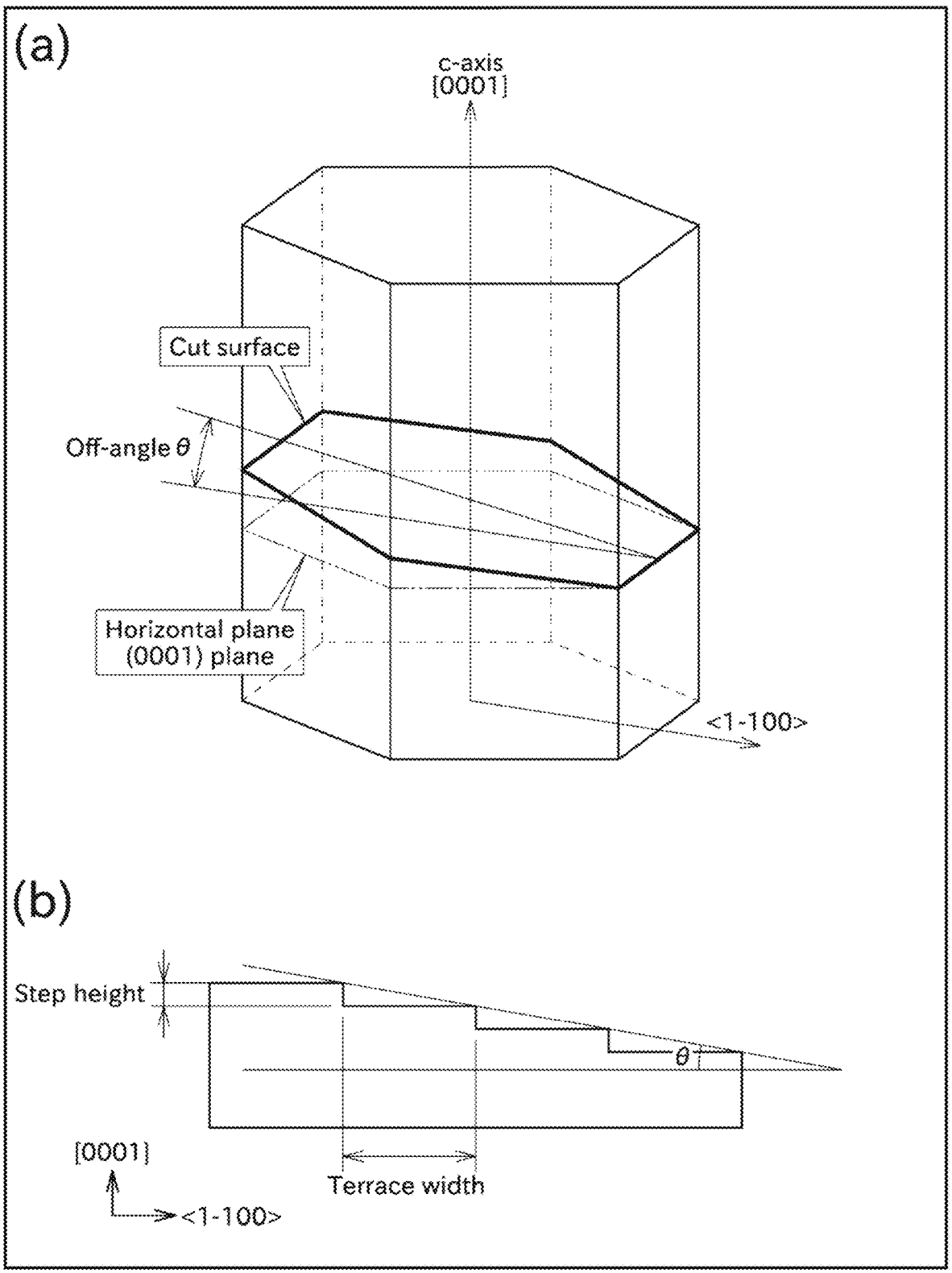
FIG. 8 is a diagram illustrating an off-angle of 4H—SiC relative to <1-100> direction.

For example, to provide an off-angle relative to <1-100> direction, the ingot 40 needs to be cut with a cut surface that is inclined toward [000-1] direction as extending in <1-100> direction, as shown in FIG. 8(a). The ratio between a step height and a terrace width varies depending on the value of an off-angle θ as shown in FIG. 8(b), and therefore it is preferable that the value of the off-angle θ is set in accordance with specifications required of an electronic device. The off-angle θ may have any value, and for example, it preferably is not more than 4°, 1°, or 0.1°, and more than 0° or 0.01°.

In a case of providing an off-angle relative to <11-20> direction, as shown in FIG. 7(a) and FIG. 7(b), every C atom in an end portion of a step (a distal end portion of a step, or an end portion constituting a surface parallel to the height direction of a step) has one dangling bond. In a case of providing an off-angle relative to <1-100> direction, as shown in FIG. 7(a) and FIG. 7(c), some of C atoms in a step end portion have one dangling bond while other some have two dangling bonds. As shown in FIG. 7(c), the number of dangling bonds included in a C atom is determined in accordance with a molecule stack direction. In a molecular layer with two dangling bonds, as compared to a molecular layer with one dangling bond, C atoms have a higher reactivity, and therefore formation of a graphene precursor is more likely to occur. Accordingly, to produce a SiC substrate 45 with a graphene precursor, it is preferable to use a SiC substrate 41 having an off-angle relative to <1-100> direction.

As a result of performing the above-described etching under Si vapor pressure by using a SiC substrate 41 having an off-angle relative to <1-100> direction, any stepped structure out of three types of stepped structures A to C shown in FIG. 9 is formed. Here, a stepped structure is a structure determined by the number of molecular layers in a step and the number of dangling bonds of each C atom in the molecular layers. In FIG. 9, the plurality of lines drawn in parallel to step surfaces indicate delimitation of SiC molecular layers. That is, the line is drawn for each monomolecular layer (i.e., at intervals of 0.25 nm) shown in FIG. 6. The thin lines put to the step end portions represent dangling bonds. The zigzag thick lines put to the steps indicate the SiC stack direction.

As shown in FIG. 9(a), in the stepped structure A having steps 41F1, 41F2, 41F3, one step is composed of four molecular layers. Thus, the step height is 1 nm. Among the four molecular layers, two molecular layers 41B at higher positions (two molecular layers, i.e., layers 41B(i) and 41B(ii), that are closer to the surface 41A) have two dangling bonds in each of their step end portions (i.e., step structures 41B-1(i) and 41(B)-1(ii) (specifically, in each of their end portions with respect to <1-100> direction), and two molecular layers 41C at lower positions (two molecular layers, i.e., layers 41C(i) and 41C(ii), farther from the surface) have one dangling bond in each of their step end portions (i.e., step structures 41C-1(i) and 41(B)-1(ii). The stepped structure A is a structure in which molecular layers each having two dangling bonds are disposed higher than molecular layers each having one dangling bond.

As shown in FIG. 9(b), in the stepped structure B, one step is composed of two molecular layers. Thus, the step height is 0.5 nm. A first step is composed only of molecular layers having two dangling bonds in each of their step end portions, and a second step is composed only of molecular layers having one dangling bond in each of their step end portions. These steps are alternately repeated.

As shown in FIG. 9(c), in the stepped structure C, one step is composed of four molecular layers. Thus, the step height is 1 nm. Among the four molecular layers, two molecular layers at higher positions (two molecular layers closer to the surface) have one dangling bond in each of their step end portions, and two molecular layers at lower positions (two molecular layers farther from the surface) have two dangling bonds in each of their step end portions.

As described above, formation of a graphene precursor is more likely to occur when a molecular layer having two dangling bond in its step end portion is disposed in the surface. Therefore, using a SiC substrate 41 with the stepped structure A makes it possible to appropriately form a graphene precursor 42.

Figure 10:
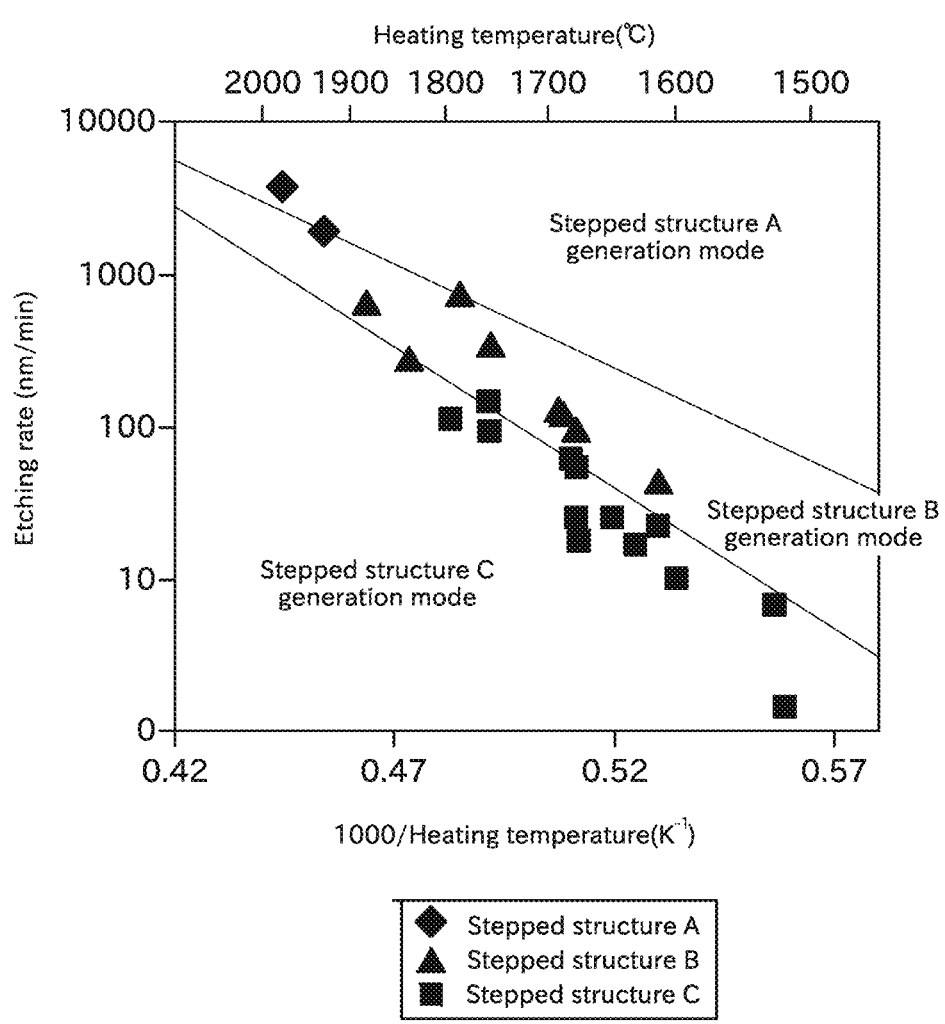
FIG. 10 is a graph of a heating temperature and an etching rate, showing regions where the respective stepped structures are generated.

Which stepped structure is formed after the etching under Si vapor pressure depends on treatment conditions. It can be considered that the treatment conditions include, for example, a heating temperature, an etching rate, an inert gas pressure, a Si atmosphere, and the like. Which stepped structure is formed when the heating temperature and the etching rate among the aforementioned conditions are varied is shown in FIG. 10. As shown in FIG. 10, the likelihood of formation of the stepped structure A increases as the etching rate increases. Thus, the etching under Si vapor pressure is preferably performed with an etching rate of 1 μm/min or more, for example. Even if the etching rate is low, the stepped structure A is formed as long as the heating temperature is low. It therefore may be acceptable that the etching rate is lower than 1 μm/min.

In a case of 4H—SiC, the stepped structures A to C can be selectively formed by adjusting the heating temperature and the etching rate in the above-described manner. From the viewpoint of appropriately forming a graphene precursor, the stepped structure A is preferred as stated above. From other viewpoints different than formation of a graphene precursor, another stepped structure may be preferred. In a case of forming an epitaxial layer on the SiC substrate 41, the properties or the shape of the epitaxial layer may vary depending on the stepped structure. This is why a technique enabling selective formation of a predetermined stepped structure is useful even in a case of forming no graphene precursor. This technique can be also used for selective formation of a structure other than the stepped structure A.

A graph shown in FIG. 10 is one example. There is a possibility that which stepped structure is formed depends also on another treatment condition. Thus, it may be possible to control the stepped structure by changing such another treatment condition.

Figure 12:
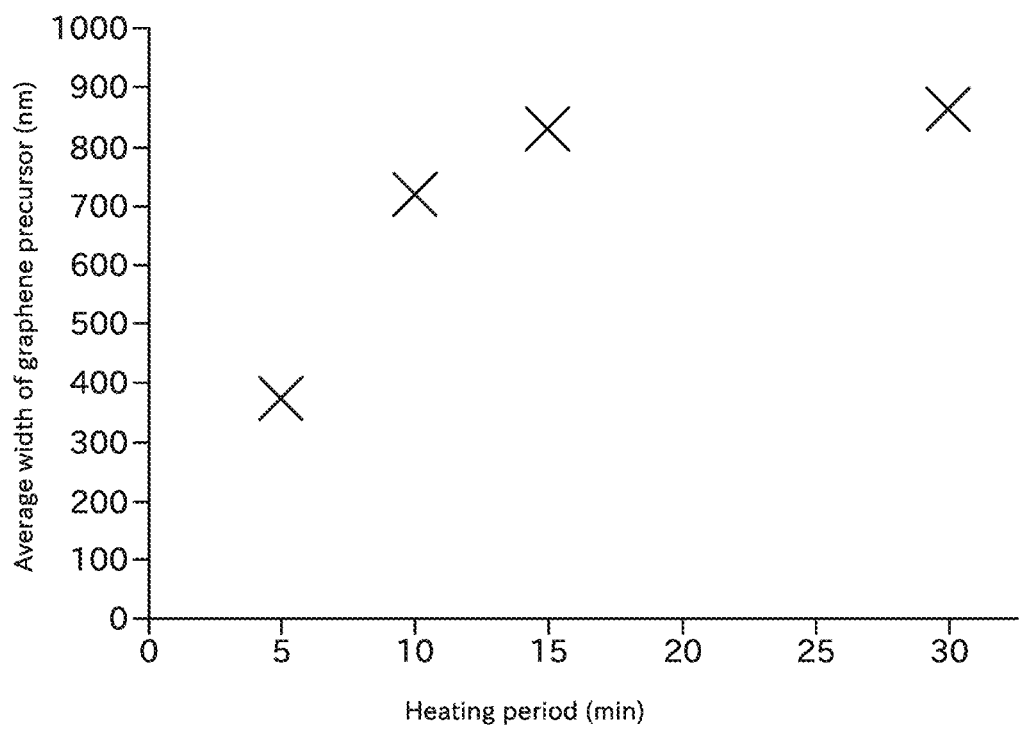
FIG. 12 is graph and table showing a relationship between a heating period and a width of a graphene precursor formed on steps of a SiC substrate.

The SiC substrate 41 having the stepped structure A obtained through the above-described process is subjected to the graphene precursor formation process, so that the graphene precursor 42 is uniformly formed on the steps of the SiC substrate 41 in accordance with a heating period, as shown in FIG. 11. Conventionally, even when a graphene precursor 42 is successfully formed, an end portion of the graphene precursor 42 is curved or the formation of the graphene precursor 42 is non-uniform. In this embodiment, as shown in SEM images of FIG. 11, an end portion of the graphene precursor 42 is substantially in parallel to the step, and the graphene precursor 42 on each step is formed almost at the same speed. In detail, as shown in a table of FIG. 12, a standard error of the width of the graphene precursor 42 has a quite low value.

The uniform formation of the graphene precursor 42 enables the graphene precursor 42 having a desired width to be formed on the steps of the SiC substrate 41. The graphene precursor 42 may be formed on the entire surface of each step of the SiC substrate 41, or may be formed only in a part of each step.

Not only a substrate having the graphene 43 formed on the entire surface of each step but also a substrate having the graphene 43 formed only in a part of each step is useful as a material of an electronic device, for the following reason: the fact that a bandgap varies depending on the width of the graphene 43 is theoretically and experimentally proved, and therefore it is possible to produce an electronic device by using graphene with a desired bandgap. Needless to say, non-uniform formation of the graphene 43 as shown in the conventional case causes a variation in the bandgap, and therefore is not suitable for production of an electronic device. Uniform formation of the graphene 43 in each step as shown in this embodiment can provide an electronic device containing graphene.

Figure 13:
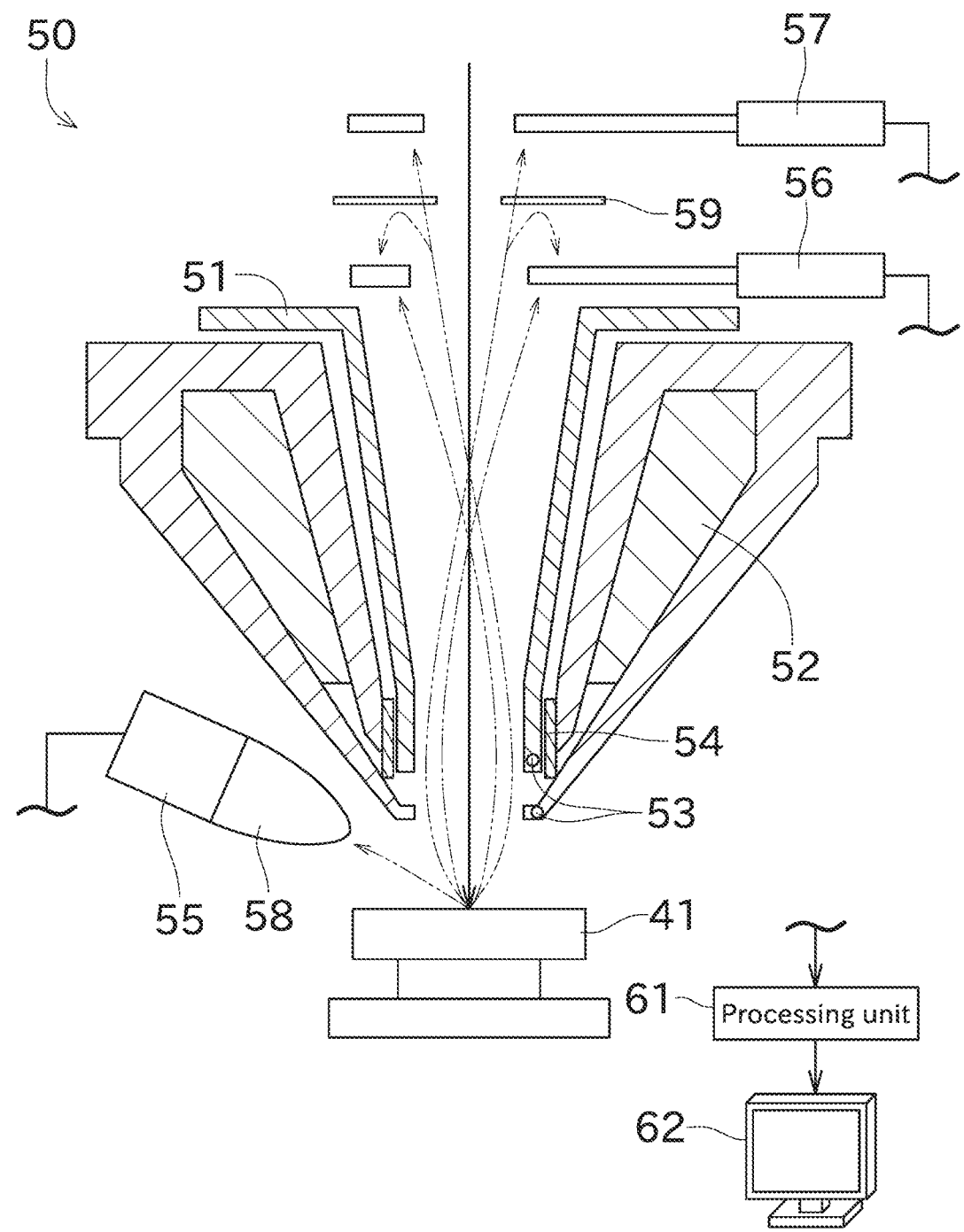
FIG. 13 is a schematic cross-sectional view showing a scanning electron microscope that is used for measurement of contrast of a SiC substrate.

A method for identifying a stepped structure provided in the SiC substrate 41 will now be described with reference to FIG. 13 and FIG. 14. First, referring to FIG. 13, a configuration of a scanning electron microscope will be briefly described. As shown in FIG. 13, a scanning electron microscope 50 includes a beam booster 51, an electromagnetic lens 52, an electrostatic lens 53, and a scan coil 54.

An electron beam emitted from an electron emitting unit (not shown) of the scanning electron microscope 50 is accelerated by the beam booster 51, is converged by the electromagnetic lens 52 and the electrostatic lens 53, and is radiated to the SiC substrate 41. The scan coil 54 is able to change a direction of the electron beam by a magnetic field generated. Thereby, a surface of the SiC substrate 41 can be scanned by the electron beam.

The scanning electron microscope 50 also includes an SE2 detector 55, an inlens detector 56, a reflected electron detector 57, a collector grid 58, and a filtering grid 59.

The SE2 detector 55 and the inlens detector 56 detect both a reflected electron and a secondary electron. The reflected electron is an electron that is emitted after an electron beam (primary electron) radiated by the scanning electron microscope 50 is repelled by a detection object surface or interacts with the SiC substrate 41. The secondary electron is an electron generated in the course of interaction caused when the primary electron is radiated to the SiC substrate 41. The collector grid 58 collects the reflected electron and the secondary electron. The filtering grid 59 determines a lower limit of energy that allows the reflected electron and the secondary electron to pass. The reflected electron detector 57 detects the reflected electron having passed through the filtering grid 59.

Detection results obtained by the SE2 detector 55, the inlens detector 56, and the reflected electron detector 57 are outputted to a processing unit 61. The processing unit 61 generates an SEM image (scanning electron microscope photograph) based on a position of the SiC substrate 41 and an electron detected at the position. The processing unit 61 outputs the generated SEM image to a display device 62. The display device 62 displays the received SEM image.

An SEM image of the SiC substrate 41 obtained by the scanning electron microscope 50 will now be described. The following description deals with an SEM image obtained in a case where an electron beam is radiated to the SiC substrate 41 with an inclination angle (incident electron angle θ) relative to a perpendicular to a Si surface of the SiC substrate 41. The incident electron angle θ can be also expressed as an inclination angle relative to <1-100> direction or the direction opposite to <1-100> direction.

Figure 14:
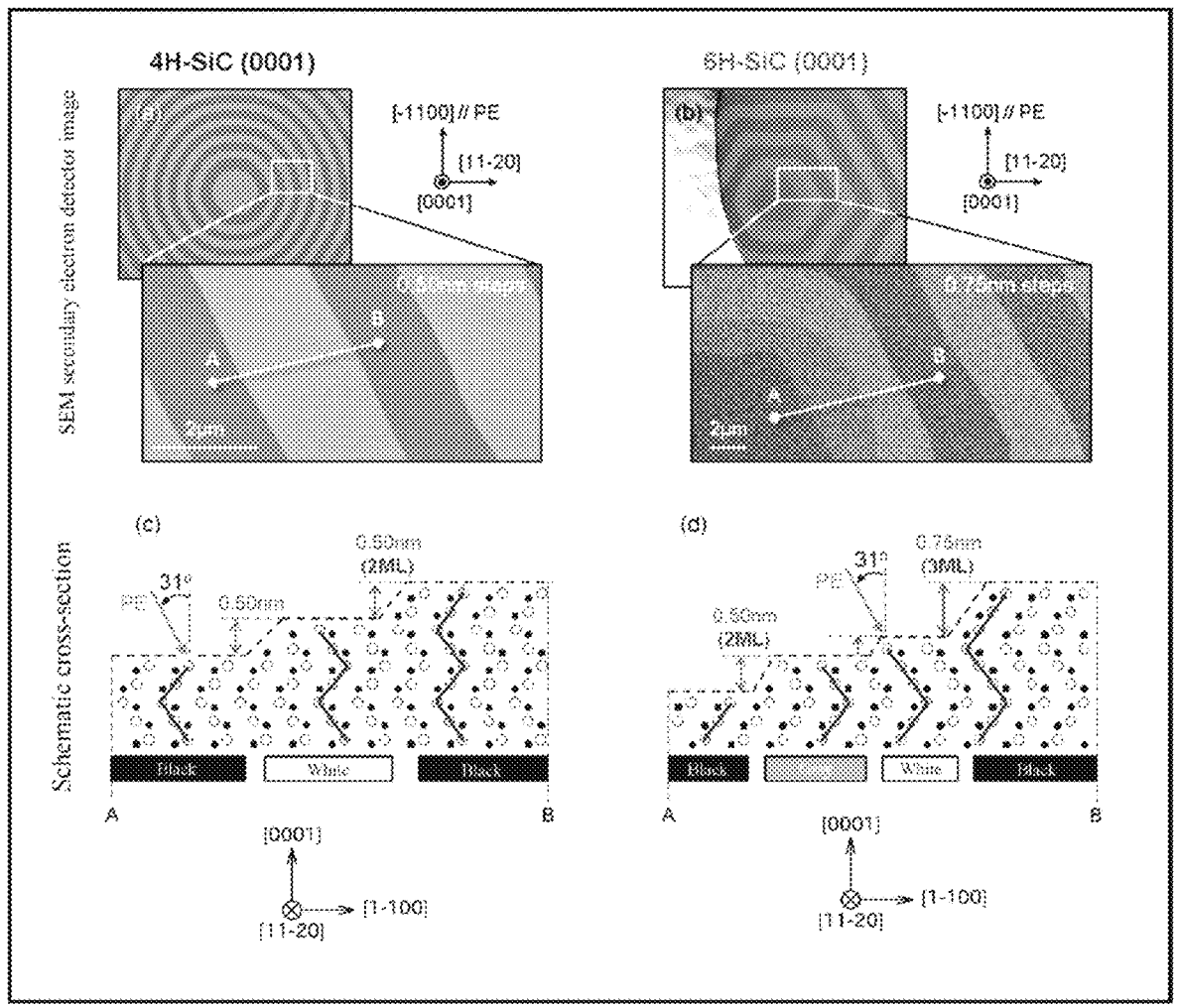
FIG. 14 is a schematic cross-sectional view containing SEM images obtained when a surface of 4H—SiC and a surface of 6H—SiC were observed.

As shown in FIG. 14, an SEM image thus obtained includes two types of regions, namely, a bright region and a dark region. A boundary between the two types of regions is coincident with a step position, as shown in FIG. 14(*a*) and FIG. 14(*c*). Accordingly, the contrast between brightness and darkness appearing on the SEM image reflects a reverse of the stack orientation directly under a surface of the SiC substrate 41. This reveals that there is a rough tendency that a reflected electron beam and a secondary electron beam have a higher intensity when an angle difference between an incident electron beam and the stack orientation directly under a step surface is smaller, as shown in FIG. 14(*c*). This also reveals that a reflected electron beam and a secondary electron beam have a lower intensity when an angle difference between an incident electron beam and the stack orientation directly under a terrace surface is greater. The same is true for 6H—SiC, as shown in FIG. 14(*b*) and FIG. 14(*d*).

As shown in FIG. 7(*c*), the stack direction directly under the step surface differs depending on whether the number of dangling bonds in the step end portion is one or two. Thus, the number of dangling bonds in the step end portion can be identified based on the SEM image as described above. Consequently, which of the stepped structures A to C is formed in the SiC substrate 41 can be identified. Accordingly, whether or not the stepped structure A which is suitable for forming a graphene precursor is formed can be checked. Even in a case of selectively forming another stepped structure, whether or not the stepped structure is actually formed can be checked.

The crucible 30 used for the graphene precursor formation process will now be described with reference to FIG. 15. As mentioned above, it is preferable that the crucible 30 made of pyrolytic carbon, which is less reactive with Si, is used for the graphene precursor formation process. This makes it possible to create the same atmosphere around the SiC substrate 41 in each of the graphene precursor formation process that are performed a plurality of times. Accordingly, the SiC substrate 45 with the graphene precursor can be produced stably.

In a case of the crucible 30 having a small capacity, it takes no time for the Si pressure inside the crucible 30 to rise, and therefore sublimation of Si atoms is less likely to progress, which reduces the speed at which the graphene precursor 42 is formed. In a case of the crucible 30 having a large capacity, it takes time for the Si pressure inside the crucible 30 to rise, and therefore sublimation of Si atoms is likely to progress, which increases the speed at which the graphene precursor 42 is formed.

Experiments conducted by the applicant(s) revealed that whether the graphene precursor 42 is formed uniformly or non-uniformly is determined in accordance with the capacity of the crucible 30. FIG. 15 shows results of the experiments. FIG. 15 shows results of the graphene precursor formation process performed under a state where the capacity of the crucible 30 was changed with the other treatment conditions unchanged.

Figure 15:
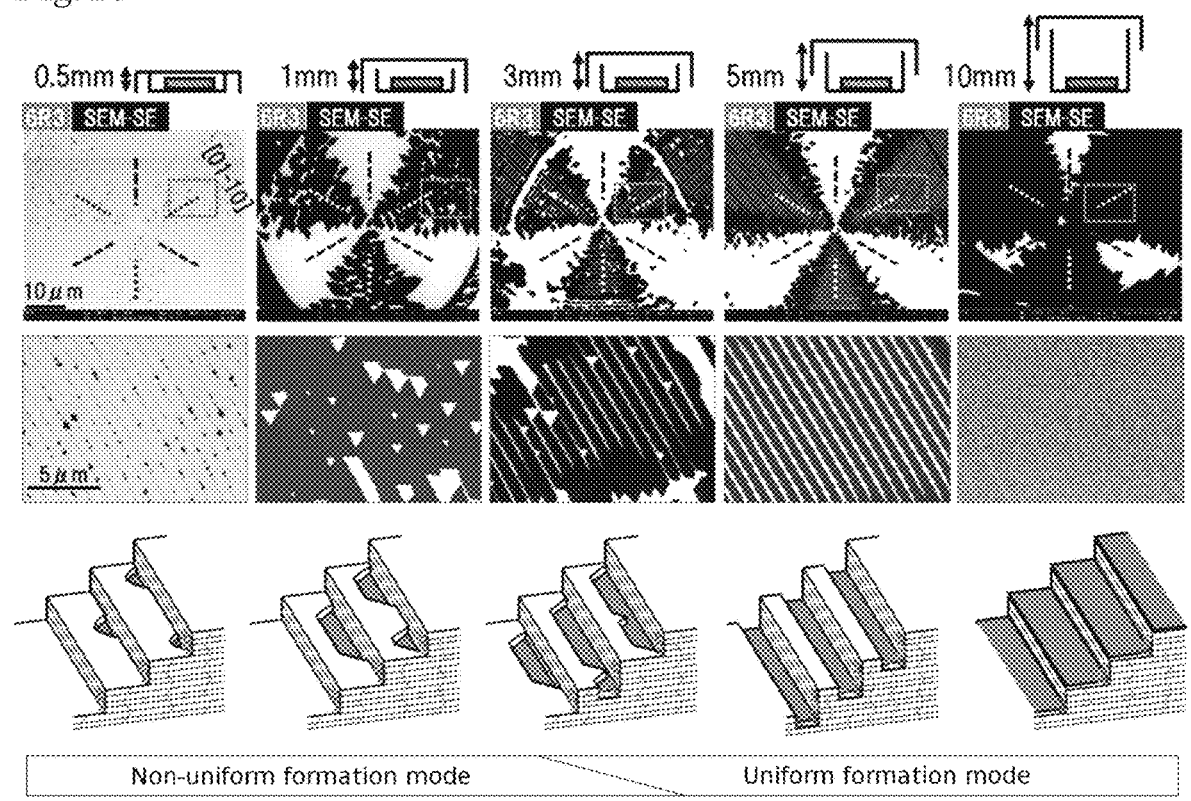
FIG. 15 is a diagram showing a relationship between a capacity of a receiving container and a graphene precursor formation mode.

In FIG. 15, the numeral given next to each crucible 30 indicates the height of the crucible 30 (since the crucibles 30 had equal base areas, the height ratio was equal to the capacity ratio). Under the numeral, an SEM image obtained by observing a Si surface of a SiC substrate 41 is shown. Under the SEM image, a part of the SEM image is shown on an enlarged scale. Under this SEM image, formation of the graphene precursor 42 is schematically shown.

From FIG. 15, it can be seen that the speed at which the graphene precursor 42 was formed increased as the height of the crucible 30 increased (as the capacity increased). It can be also seen that formation of the graphene precursor 42 was more likely to be uniform as the capacity of the crucible 30 increased.

Thus, preparing a plurality of crucibles 30 having different capacities and subjecting each of the crucibles 30 to the graphene precursor formation process makes it possible to estimate a capacity of the crucible 30 necessary for the graphene precursor 42 to be formed uniformly. In other words, a capacity of the crucible 30 necessary for uniform formation of the graphene precursor 42 can be identified.

As thus described above, the method for producing the SiC substrate 45 with the graphene precursor according to this embodiment includes a graphene precursor formation process of: heating the SiC substrate 41 to sublimate Si atoms in the Si surface of the SiC substrate 41 so that the graphene precursor 42 is formed; and stopping the heating before the graphene precursor 42 is covered with the graphene 43. The SiC substrate 41 to be treated in the graphene precursor formation process is provided with a step including a plurality of molecular layers. The step has the stepped structure A in which a molecular layer whose C atom has two dangling bonds is disposed closer to the surface than a molecular layer whose C atom has one dangling bond.

Using the SiC substrate 41 having the stepped structure A enables the graphene precursor 42 to be uniformly formed on the Si surface of the SiC substrate 41. It therefore is possible to obtain a structure in which the graphene precursor 42 is formed substantially throughout the Si surface of the SiC substrate 41 and in addition the graphene precursor 42 is not covered with the graphene 43. Although the graphene precursor 42 is not covered with the graphene 43 at all, it may be also acceptable that a very small range of the graphene precursor 42 is covered with the graphene 43. For example, inserting another element between the SiC substrate 41 and the graphene precursor 42 enables the graphene 43 to be disposed directly on the SiC substrate 41. In such a configuration, an electron state of the graphene 43 can be changed by changing the element inserted between the SiC substrate 41 and the graphene precursor 42.

In the production method according to this embodiment, the SiC substrate 41 is provided with an off-angle relative to <1-100> direction.

Providing the off-angle in this direction allows the above-described stepped structure to be formed easily.

In the production method according to this embodiment, in a case where the SiC substrate 41 to be treated in the graphene precursor formation process is made of 4H—SiC, a step including four molecular layers is formed, and in two of the molecular layers at higher positions in the step, a C atom has two dangling bonds, while in two of the molecular layers at lower positions in the step, a C atom has one dangling bond.

Thus, by adjusting the treatment conditions, the SiC substrate 41 having the above-described stepped structure A formed on a substantially entire surface thereof can be obtained, and therefore the SiC substrate 45 with the graphene precursor can be produced efficiently.

In the production method according to this embodiment, an etching process is performed prior to the graphene precursor formation process, the etching process including etching the SiC substrate 41 by heating the SiC substrate 41 under Si vapor pressure.

Etching the SiC substrate 41 in this manner allows the above-described stepped structure A to be formed easily.

In the production method according to this embodiment, the etching process is performed under predetermined treatment conditions including at least the heating temperature and the etching rate.

Performing the etching in consideration of such treatment conditions allows the above-described stepped structure to be formed easily.

In the production method according to this embodiment, the etching process is performed at an etching rate of 1 μm/min or more.

This allows the above-described stepped structure to be formed easily.

In the production method according to this embodiment, the graphene precursor formation process is performed at 1400° C. or more and 2000° C. or less, and preferably performed at 1550° C. or more and 1650° C. or less.

When the heating temperature is too high, the speed at which the graphene precursor 42 is formed increases excessively, which causes a risk that stopping the treatment at a timing when the graphene precursor 42 is formed in a desired range may be difficult or a surface of the SiC substrate 41 may be roughened. When the heating temperature is too low, the graphene precursor 42 is not formed appropriately. Considering these, performing the graphene precursor formation process in the above-mentioned temperature range makes it possible to control a range where the graphene precursor 42 is formed with a good accuracy.

In the production method according to this embodiment, the graphene precursor formation process is performed in a state where the SiC substrate 41 is received in the crucible 30 having at least its inner surface made of pyrolytic carbon.

Since pyrolytic carbon is less reactive with sublimated Si atoms, an environment (e.g., the kind of existing vapor, the pressure, etc.) within a treatment container can be highly reproducible. Accordingly, a range where the graphene precursor is formed can be controlled with a good accuracy. Here, it is only required that the inner surface of the crucible 30 be made of pyrolytic carbon, and whether the whole or a part is made of pyrolytic carbon does not matter.

In the production method according to this embodiment, in the graphene precursor formation process, the graphene precursor 42 is formed uniformly from a proximal end side 41D toward a distal end side 41E of the step of the SiC substrate 41.

This can provide a structure in which, for example, the graphene precursor 42 having substantially the same width is formed at fixed intervals. Accordingly, the graphene 43 having a desired bandgap can be produced.

In the production method according to this embodiment, a shape obtained by multiplying one side of a diamond shape formed by connecting four adjacent Si atoms in the Si surface of the SiC substrate 41 by $6\sqrt{3}$ and rotating a resultant by 30° about a rotation axis extending in a direction orthogonal to the Si surface serves as a minimum pattern of overlap between an arrangement pattern of Si atoms in the Si surface and an arrangement pattern of C atoms in the graphene precursor 42.

Since the arrangement pattern of Si atoms in the Si surface and the arrangement pattern of C atoms in the graphene precursor 42 overlap each other, relatively strong connection between the graphene precursor 42 and the SiC substrate 41 can be obtained.

In this embodiment, an element is inserted between the graphene precursor 42 and the SiC substrate 41, thereby breaking the joint between the graphene precursor 42 and the SiC substrate 41, to produce the SiC substrate 46 with graphene in which the graphene 43 is formed on the SiC substrate 41 without interposition of the graphene precursor 42 therebetween.

Accordingly, just by changing an element to be inserted, SiC substrates 46 with graphene having different electron states can be produced from identical SiC substrates 45 with a graphene precursor.

In this embodiment, whether or not the SiC substrate 41 for use in the graphene precursor formation process has the stepped structure A is identified based on brightness and darkness on an SEM image that is obtained by radiating an electron beam from the scanning electron microscope 50 in a direction inclined relative to the height direction of the step of the SiC substrate 41.

Since whether or not the stepped structure A is present can be identified based on brightness and darkness on the SEM image, it is easy to identify a treatment condition necessary for obtaining the stepped structure A.

In this embodiment, the graphene precursor formation process is performed in a plurality of crucibles 30 having different capacities, and whether the graphene precursor is formed uniformly from the proximal end side toward the distal end side of the step of the SiC substrate 41 or the graphene precursor is formed non-uniformly on the SiC substrate 41 is observed to identify a capacity required of the crucible 30.

Accordingly, it is easy to identify a capacity of the crucible 30 necessary for uniform growth of the graphene precursor 42.

Although a preferred embodiment of the present invention has been described above, the foregoing configuration may be modified, for example, as follows.

Although the embodiment described above employs the SiC substrate 41 of single crystal 4H—SiC, another composition (e.g., single crystal 6H—SiC) may be adoptable. In a case of 4H—SiC, as shown in FIG. 6(a), a half unit is composed of two layers and a full unit is composed of four layers. An obtained stepped structure, therefore, has two or four molecular layers, and there is a high likelihood that the number of dangling bonds of each C atom changes every two molecular layers. In a case of 6H—SiC, as shown in FIG. 6(b), a half unit is composed of three layers and a full unit is composed of six layers. An obtained stepped structure, therefore, has three molecular layers or six molecular layers, and there is a high likelihood that the number of dangling bonds of each C atom changes every three molecular layers. Thus, it would be reasonable to consider that a stepped structure of 6H—SiC that corresponds to the stepped structure A of 4H—SiC is provided with a step including six molecular layers, and in three of the molecular layers at higher positions in the step, a C atom has two dangling bonds, while in three of the molecular layers at lower positions in the step, a C atom has one dangling bond. In this stepped structure, similarly to the case of 4H—SiC, appropriate formation of a graphene precursor would be likely to occur. Thus, in a case of polymorphism other than 4H—SiC, there is a likelihood that the graphene precursor 42 is uniformly formed even through a step has a structure different from the stepped structure A.

The treatment conditions (the temperature, the pressure, the etching rate, etc.) illustrated in the embodiment described above are merely an example, and can be changed as appropriate.

REFERENCE SIGNS LIST 20 high-temperature vacuum furnace
30 crucible (receiving container)
40 ingot
41 SiC substrate
42 graphene precursor
43 graphene
44 intercalant layer
45 SiC substrate with graphene precursor
46 SiC substrate with graphene
50 scanning electron microscope

The invention claimed is:

1. A method for producing a graphene precursor on a substrate made of 4H—SiC, the method comprising:
   providing the substrate made of 4H—SiC, the substrate made of 4H—SiC having steps comprising a first step, a second step and a third step, each of the steps having an upper surface with a terrace width, a step height from the first step to the second step being the same as the step height from the second step to the third step, the terrace width of the first step, the second step and the third step being the same, each of the steps comprising:
   a first molecular layer having the upper surface, the first molecular layer having a first stepped structure whose C atom has two dangling bonds;
   a second molecular layer below the first molecular layer, the second molecular layer having a second stepped structure whose C atom has two dangling bonds;
   a third molecular layer below the second molecular layer, the third molecular layer having a third stepped structure whose C atom has one dangling bond; and
   a fourth molecular layer below the third molecular layer, the fourth molecular layer having a fourth stepped structure whose C atom has one dangling bond,
   heating the substrate made of 4H—SiC to sublimate Si atoms from the first molecular layer in each of the steps to form the graphene precursor on the first molecular layer in each of the steps; and
   stopping the heating before the graphene precursor on the first molecular layer in each of the steps becomes graphene, thereby producing the graphene precursor on the 4H—SiC substrate.

2. The method for producing a graphene precursor on a substrate made of 4H—SiC according to claim 1, wherein the substrate made of 4H—SiC is provided with an off-angle relative to <1-100> direction.

3. The method for producing a graphene precursor on a substrate made of 4H—SiC according to claim 1, further comprising
   an etching process performed prior to sublimating the Si atoms by heating the substrate made of 4H—SiC under a Si vapor pressure.

4. The method for producing a graphene precursor on a substrate made of 4H—SiC according to claim 3, wherein the etching process is performed under a predetermined treatment condition including at least a heating temperature and an etching rate.

5. The method for producing a graphene precursor on a substrate made of 4H—SiC according to claim 3, wherein the etching process is performed by adjusting at least an etching rate of 1 um/min or more and a heating temperature of 1400° C. to 2000° C.

6. The method for producing a graphene precursor on a substrate made of 4H—SiC according to claim 5, wherein the etching process is performed to provide the substrate made of 4H—SiC in which each of the steps is formed of the first molecular layer, the second molecular layer, the third molecular layer and the fourth molecular layer.

7. The method for producing a graphene precursor on a substrate made of 4H—SiC according to claim 1, wherein the substrate made of 4H—SiC is heated to sublimate the Si atoms at 1400° C. or more and 2000° C. or less.

8. The method for producing a graphene precursor on a substrate made of 4H—SiC according to claim 1, wherein the substrate made of 4H—SiC is heated to sublimate the Si atoms at 1550° C. or more and 1650° C. or less.

9. The method for producing a graphene precursor on a substrate made of 4H—SiC according to claim 1, wherein the substrate made of 4H—SiC is heated to sublimate the Si atoms in a treatment container having at least its inner surface made of pyrolytic carbon.

10. The method for producing a graphene precursor on a substrate made of 4H—SiC according to claim 1, wherein the graphene precursor has a six-membered ring structure when viewed in a thickness direction, the graphene precursor consisting of C atoms in which one out of every three C atoms of the graphene precursor is connected to a Si atom of the second molecular layer, wherein a thickness of the graphene precursor in the thickness direction is equal to a thickness of one C atom.

11. The method for producing a graphene precursor on a substrate made of 4H—SiC according to claim 1, wherein the substrate made of 4H—SiC is heated to sublimate the Si atoms from the first molecular layer in each of the steps at a temperature of 1550 to 2200° C. to form the graphene precursor on the first molecular layer in each of the steps.

* * * * *